(12) United States Patent
Lee

(10) Patent No.: US 9,735,119 B1
(45) Date of Patent: Aug. 15, 2017

(54) CONDUCTIVE PADS FORMING METHOD

(71) Applicant: Micron Technology, Inc., Boise, ID (US)

(72) Inventor: Tzung-Han Lee, Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/219,265

(22) Filed: Jul. 25, 2016

(51) Int. Cl.
  *H01L 23/00* (2006.01)
  *H01L 21/66* (2006.01)
  *H01L 23/544* (2006.01)

(52) U.S. Cl.
  CPC .............. *H01L 24/03* (2013.01); *H01L 22/32* (2013.01); *H01L 23/544* (2013.01); *H01L 24/06* (2013.01); *H01L 24/43* (2013.01); *H01L 24/46* (2013.01); *H01L 24/85* (2013.01); *H01L 2224/05567* (2013.01)

(58) Field of Classification Search
  CPC ........... H01L 23/5226; H01L 21/76802; H01L 21/76843; H01L 23/53266; H01L 24/03; H01L 24/06; H01L 22/32; H01L 24/46; H01L 24/85; H01L 23/544; H01L 24/43; H01L 2224/05567
  USPC .......................................... 257/751; 438/612
  See application file for complete search history.

(56) References Cited

U.S. PATENT DOCUMENTS

2009/0032957 A1*  2/2009  Chang .................... H01L 24/03
                                                     257/763

* cited by examiner

Primary Examiner — Caleen Sullivan
(74) Attorney, Agent, or Firm — TraskBritt

(57) ABSTRACT

In some embodiments, the present disclosure provides a conductive pads forming method. The conductive pads forming method may include providing a contact pad or a test pad electrically connected to a semiconductor component; and forming the conductive pads electrically connected to the contact pad or the test pad through the conductive routes, respectively.

16 Claims, 10 Drawing Sheets

CONDUCTIVE PADS FORMING METHOD

BACKGROUND

Field of Invention

The present disclosure relates to a semiconductor device. More particularly, the present disclosure relates to a method of forming conductive pads for a semiconductor device.

Description of Related Art

Conventional semiconductor devices may require electrical tests, such as a wafer acceptance test (WAT), or other electrical properties tests, with a test probe contacting a single test pad or a single contact pad electrically connected to the semiconductor device, such that the test probe may generate test-probing marks on the test pad and/or the contact pad. However, the electrical properties of the contact pad or the test pad may be altered by the testing-probe marks; and moreover, the altered electrical properties of the contact pad may further influence electrical connections of the semiconductor component with other semiconductor components, which may induce an unstable quality of fabricating the semiconductor device after administering the electrical tests.

Fabrication processes of forming semiconductor devices may include electrical tests to fulfill the fabrication. As aforementioned, the available structure of a semiconductor device may create inconvenience and defects, and needs further improvement. To address the problems, the ordinarily skilled artisans have been striving to attain a solution, yet have still not been able to develop a suitable solution. Therefore, it is important to effectively deal with the problems in the art.

SUMMARY

The present disclosure provides a conductive pads forming method. The conductive pads forming method includes providing a contact pad electrically connected to a semiconductor component; and forming conductive pads connected to the contact pad, respectively.

According to an embodiment of the present disclosure, the forming of the conductive pads may include forming conductive routes electrically connected to each other; and forming the conductive pads electrically connected to the contact pad through the conductive routes respectively.

According to an embodiment of the present disclosure, the forming of the conductive pads may include forming conductive routes insulated with each other above the contact pad; and forming the conductive pads electrically connected to the contact pad through the conductive routes, respectively.

According to an embodiment of the present disclosure, the conductive pads forming method may further include bonding metal wires to the conductive pads, respectively.

According to an embodiment of the present disclosure, the bonding of the metal wires may include embedding the metal wires into the conductive pads.

The present disclosure provides a conductive pads forming method. The conductive pads forming method includes providing a wafer comprising a test pad; and forming conductive pads on the wafer, wherein the conductive pads are electrically connected to the test pad.

According to an embodiment of the present disclosure, the forming of the conductive pads may include forming conductive routes each electrically connected between a corresponding one of the conductive pads and the test pad.

According to an embodiment of the present disclosure, the forming of the conductive pads may include forming the conductive routes electrically connected to each other.

According to an embodiment of the present disclosure, the forming of the conductive routes may include forming the conductive routes insulated with each other above the test pad.

According to an embodiment of the present disclosure, the conductive pads forming method may further include forming a plurality of scribe lines on the wafer; forming a via on the wafer between two adjacent scribe lines; and forming the test pad inside the via.

According to an embodiment of the present disclosure, the conductive pads forming method may further include thinning the wafer, to form first regions and second regions, wherein the second regions are located between the first regions and the via, and second surfaces of the wafer on the second regions are lower compared to first surfaces of the wafer on the first regions; and forming the conductive pads on the second regions.

According to an embodiment of the present disclosure, the forming of the via and the thinning of the wafer are performed at the same time.

According to an embodiment of the present disclosure, a surface of the conductive pads away from the wafer is substantially aligned with or lower than a surface of the wafer on the first regions.

According to an embodiment of the present disclosure, the forming of the conductive pads may include forming the conductive pads across the scribe lines.

According to an embodiment of the present disclosure, the conductive pads forming method may further include bonding metal wires to the conductive pads, respectively.

According to an embodiment of the present disclosure, the bonding of the metal wires may include embedding the metal wires into the conductive pads.

It is to be understood that both the foregoing general description and the following detailed description are by way of example, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
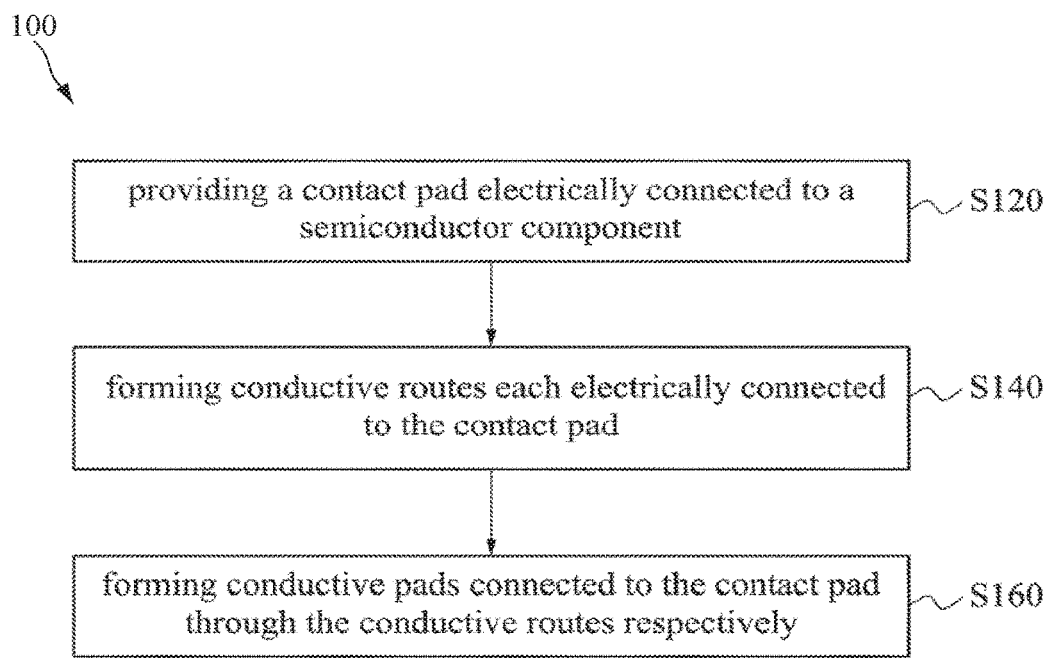
FIG. 1 is a flowchart of a conductive pads forming method according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present.

FIG. 1 illustrates a flowchart of a conductive pads forming method 100, to fabricate conductive pads for a semiconductor device according to some embodiments of the present disclosure. As shown in FIG. 1, the conductive pads forming method 100 begins with step S120 in which a contact pad electrically connected to a semiconductor component, such as dies or other suitable components, is provided. Subsequently, the conductive pads forming method 100 continues with step S140 in which conductive routes are formed to electrically connect to the contact pad. Then, the conductive pads forming method 100 continues with step S160 in which conductive pads are formed, and electrically connected to the contact pad through the conductive routes, respectively. In some embodiments, the contact pad can be formed on a substrate, and the conductive routes and the conductive pads are formed on the contact pad, and extended away from the substrate.

Owing to the conductive pads forming method 100, which forms conductive pads electrically connected to the contact pad, such that the testing probe can contact the conductive pads, the conductive pads can be further electrically connected with the semiconductor component on which the electrical tests are executed. The electrical tests described herein may be a wafer acceptance test (WAT). As a consequence, the conductive pads may be adopted as test pads, and the testing-probe marks generated by the testing probe under the repetitive electrical tests would only be generated on the conductive pads instead of the contact pad, such that the forming of the conductive pads can provide a greater area for testing probe contacting, and prevent or avoid the contact pad being damaged by the testing-probe marks under the repetitive electrical tests.

In addition, in some embodiments, the semiconductor component can further employ an exposed surface of the contact pad or a portion of the conductive pads without the testing-probe marks to electrically connect with other components. Owing to the electrical properties of the contact pad or a portion of the conductive pads without the testing-probe marks may have stable electrical properties compared to the electrical properties of the contact pad or conductive pads with the testing-probe marks. The conductive pads may replace the contact pad for being contacted with the testing probe, which may keep the contact pad intact for further electrical connections. For example, the contact pad or the portion of the conductive pads without the testing-probe marks can be electrically connected to other semiconductor components.

Figure 2:
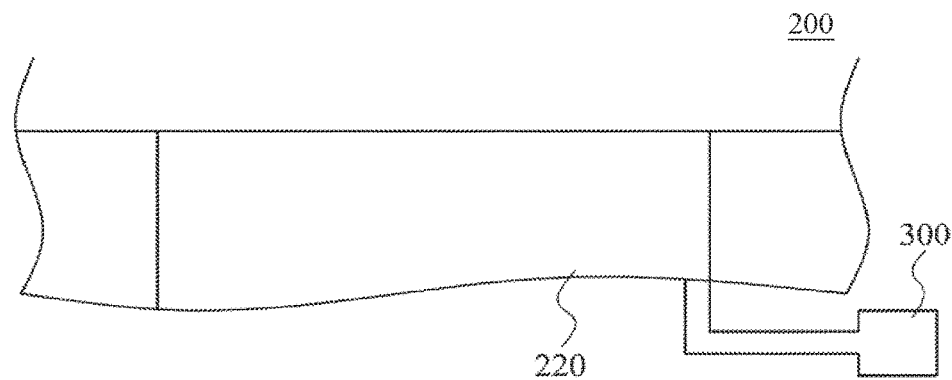
FIG. 2 to FIG. 3B are cross-sectional views of forming conductive routes on a contact pad to form a semiconductor device at various states according to some embodiments of the present disclosure.
Figure 3A:
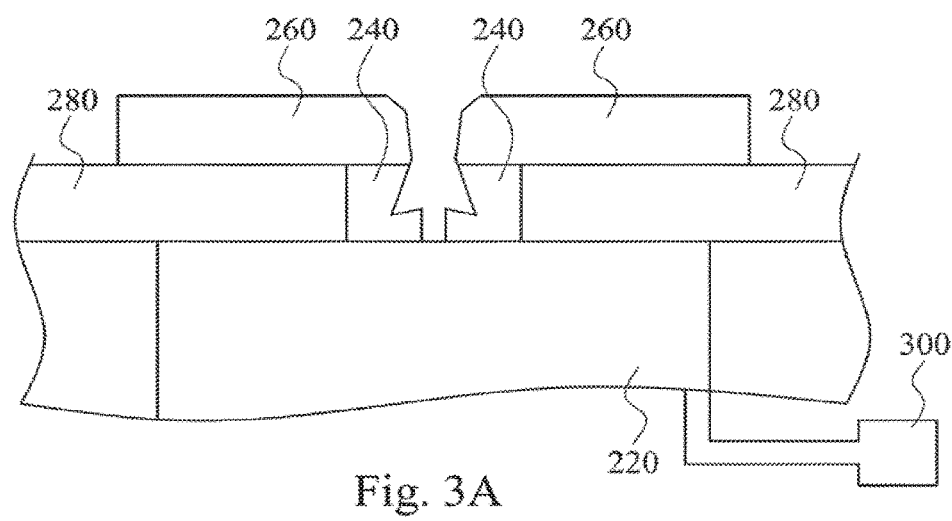
Figure 3B:
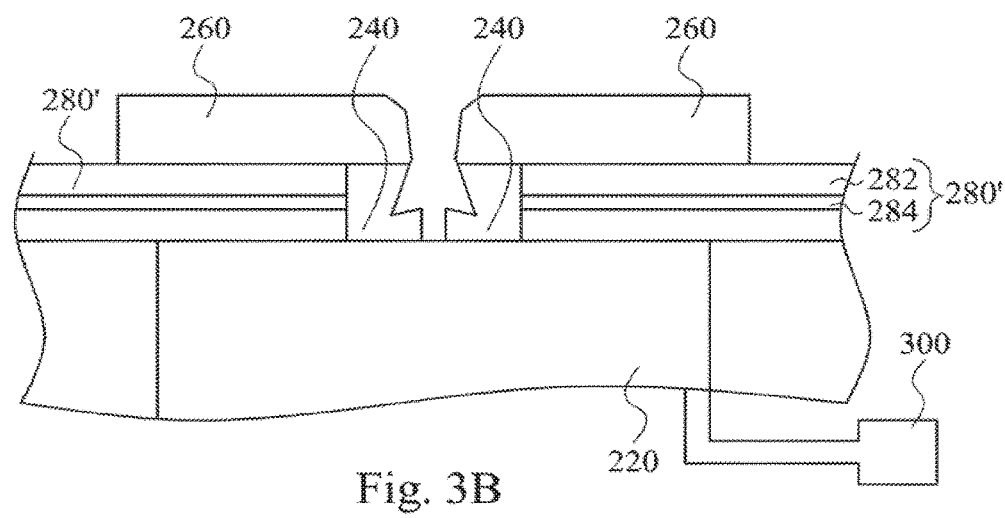

FIG. 2 to FIG. 3B illustrate cross-sectional views of forming conductive routes 240 on a contact pad 220 to form a semiconductor device 200 at various stages according to some embodiments of the present disclosure. As shown in FIG. 2, a contact pad 220 is provided. In some embodiments, the contact pad 220 can be electrically connected to a semiconductor component 300, such as a device die or other suitable semiconductor component.

Referring to FIG. 3A, in some embodiments, supporting layers 280 are formed on the contact pad 220. Subsequently, in some embodiments, conductive routes 240 are formed along the edge of each of the supporting layers 280, and insulated with each other above the contact pad 220, in which the conductive routes 240 are electrically connected to the contact pad 220, respectively. Subsequently, conductive pads 260 are respectively formed on the supporting layers 280, and part of the conductive pads 260 are further formed on the conductive routes 240 to electrically connect with the conductive routes 240, respectively. As a consequence, the conductive pads 260 are electrically connected to the contact pad 220 through the conductive routes 240, respectively. In some embodiments, the conductive routes 240 and the conductive pads 260 can be formed at the same time. Therefore, a semiconductor device 200 including a contact pad 220, the conductive routes 240 and the conductive pads 260 is formed, and electrical tests can be executed on the semiconductor component 300 through the contact pad 220 in a manner such as employing a testing probe on one of the conductive pads 260, or employing two or more testing probes with different inputs on the conductive pads 260, to generate various input conditions, such as electric field gradients, etc., for various electrical tests. That is, while the conductive routes 240 are insulated with each other above the contact pad 220, the electrical tests executed by the testing probes may have a greater flexibility. On the other hand, in some embodiments, various electrical inputs can also be electrically connected to the conductive pads 260, which could be adjusted to actual demand by those skilled in the art, without departing from the scope or the spirits of the present disclosure.

Referring to FIG. 3A, in some embodiments, the supporting layers 280 are formed with a single interlayer. Referring to FIG. 3B, in other embodiments, the supporting layers 280' are formed with multiple interlayers, for example, an interlayer 282, and interlayers 284 sandwiched between the interlayer 282. In some embodiments, material of the interlayer 282 may include silicon nitride or other suitable hardness tunable material, to adjust the hardness of the supporting layers 280'.

Figure 4A:
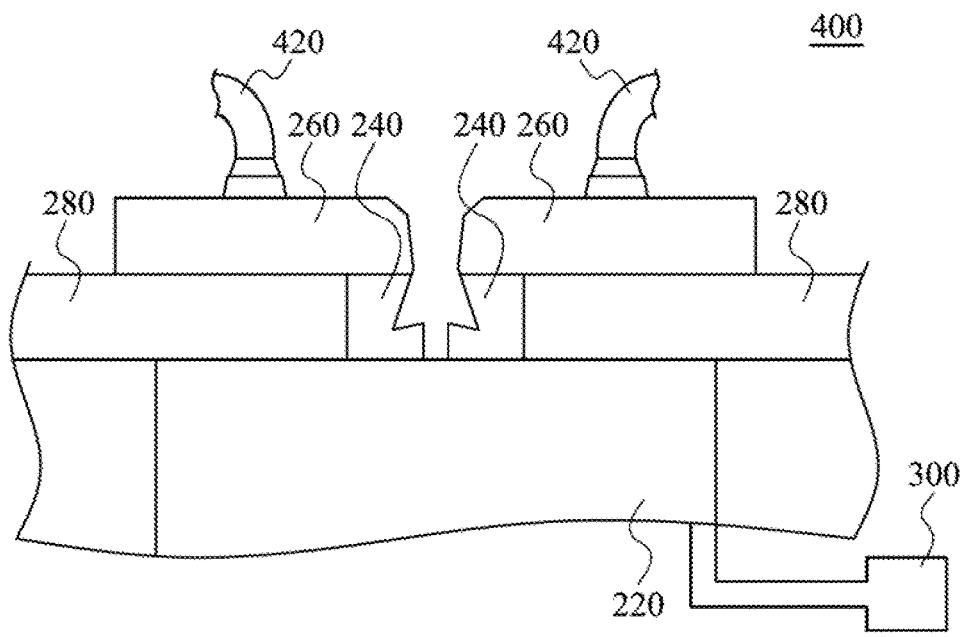
FIG. 4A and FIG. 4B are cross-sectional views of a semiconductor device according to various embodiments of the present disclosure.
Figure 4B:
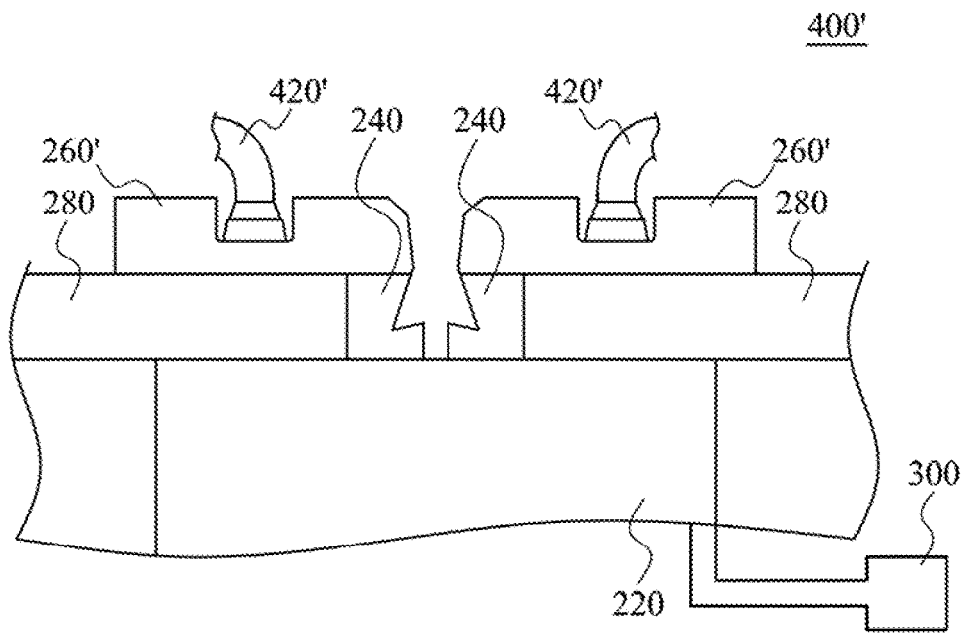

FIG. 4A and FIG. 4B illustrate cross-sectional views of a semiconductor device 400 and a semiconductor device 400', respectively according to various embodiments of the present disclosure. As shown in FIG. 4A, in some embodiments, a semiconductor device 400 may further include metal wires 420 being bonded to the conductive pads 260, respectively. In some embodiments, the metal wires 420 are bonded onto a portion of the conductive pads 260 without the testing-probe marks, to avoid contacting the testing-probe marks for pursuing stable electrical properties. In some embodiments, material of the metal wires 420 can be silver, silver alloy, copper, copper alloy, or other suitable conductive material or alloy. That is, in some embodiments, the semiconductor device 400 may employ the metal wires 420 to electrically connect to other semiconductor devices or other semiconductor components.

Referring to FIG. 4B, in other embodiments, the metal wires 420' are bonded to form a semiconductor device 400' while an end of each of the metal wires 420' is embedded into the conductive pads 260', to enhance bonding strength between the metal wires 420' and the conductive pads 260'.

Figure 5:
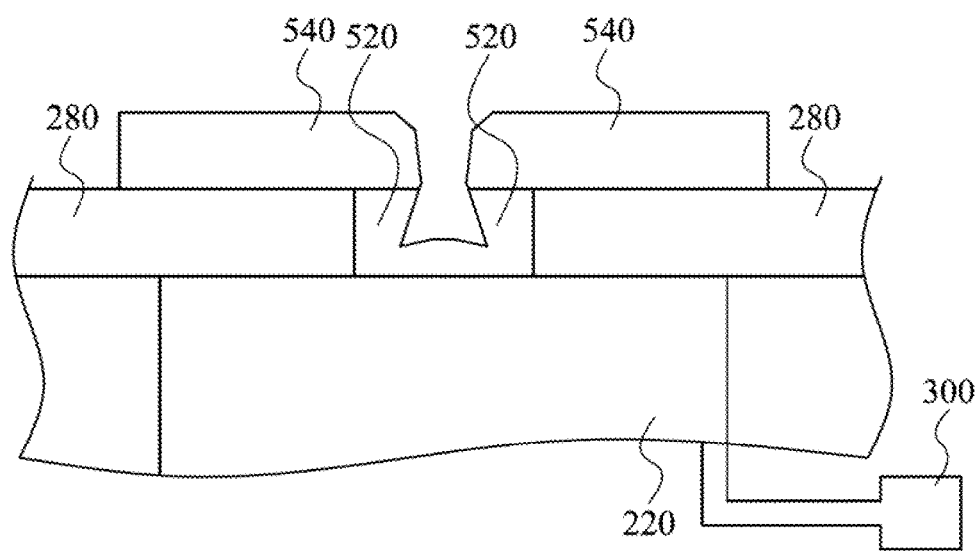
FIG. 5 is a cross-sectional view of a semiconductor device according to other embodiments of the present disclosure.

FIG. 5 illustrates a cross-sectional view of a semiconductor device 500 according to other embodiments of the present disclosure. As shown in FIG. 5, in some embodiments, conductive routes 520 are formed electrically connected to each other, and the conductive routes 520 are electrically connected to the contact pad 220 collectively. Subsequently, conductive pads 540 are formed on the conductive routes 520, and the conductive pads 540 are electrically connected to the contact pad 220 through the conductive routes 520 respectively. In some embodiments, the conductive routes 520 and the conductive pads 540 can be formed collectively. Therefore, the conductive routes 520 may contact to the contact pad 220 with a greater area, which can endure greater current or input.

Figure 6:
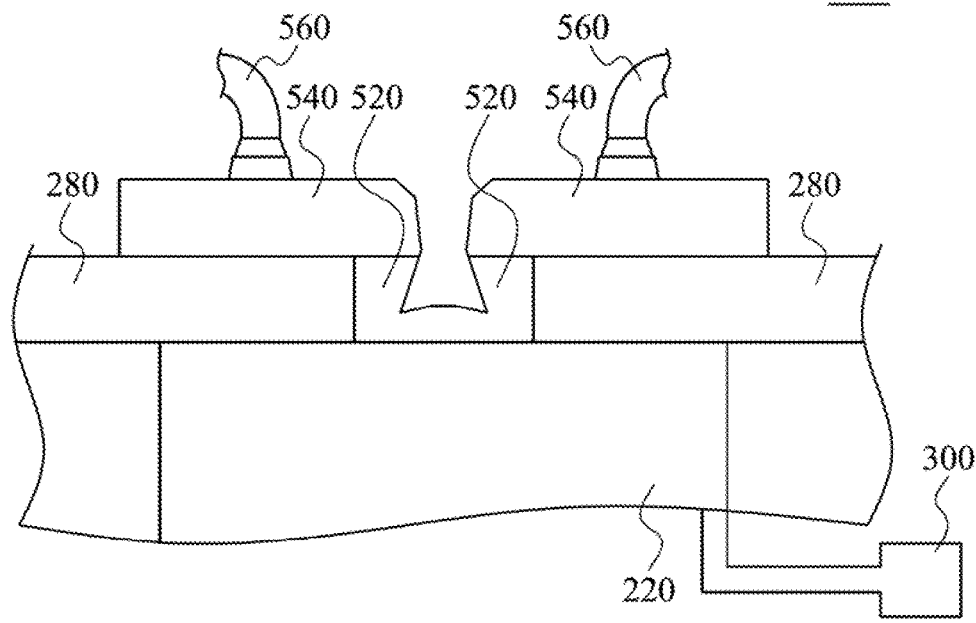
FIG. 6 is a cross-sectional view of a semiconductor device according to other embodiments of the present disclosure.

FIG. 6 illustrates a cross-sectional view of a semiconductor device 500' according to other embodiments of the present disclosure. As shown in FIG. 6, in some embodiments, a semiconductor device 500' may further include metal wires 560 being bonded to the conductive pads 540, respectively. In some embodiments, the metal wires 560 can be bonded onto a portion of the conductive pad 540 without the testing-probe marks, to avoid contacting the testing-probe marks to pursue stable electrical properties.

Figure 7A:
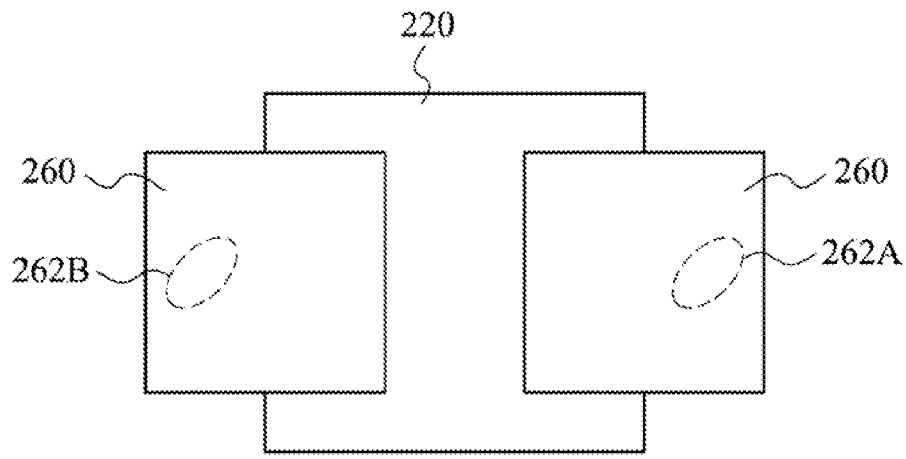
FIG. 7A and FIG. 7B are schematic top views of a semiconductor device according to various embodiments of the present disclosure.
Figure 7B:
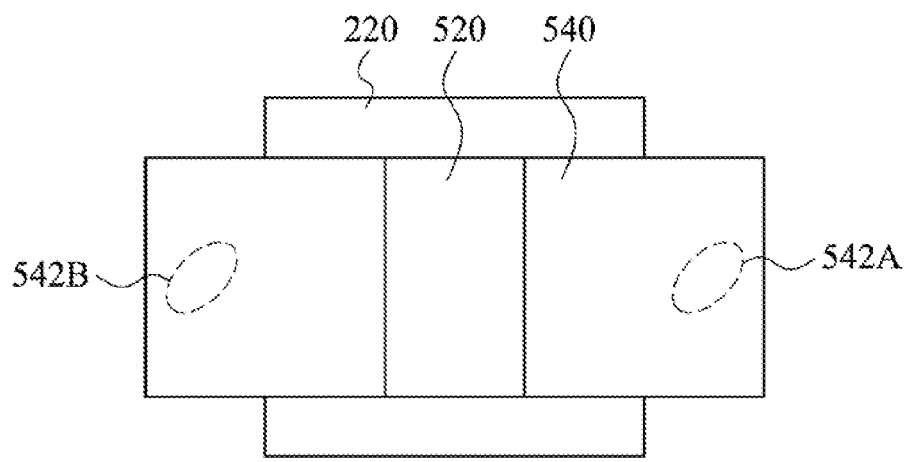

FIG. 7A and FIG. 7B, respectively, illustrate schematic top views of a semiconductor device 200 and a semiconductor device 500, according to various embodiments of the present disclosure. Referring FIG. 3 and FIG. 7A collaboratively, in some embodiments, a portion of the conductive pads 260 may extend outside the contact pad 220 along a direction parallel to a surface of the contact pad 220. In some embodiments, the testing probe can contact the conductive pads 260 in restricted areas, for example, area 262A and area 262B. Therefore, the testing-probe marks would be generated within the area 262A and area 262B, and leave the rest of the part of the conductive pads 260 and the contact pad 220 intact, to maintain the electrical properties of the contact pad 220 and the conductive pads 260 without the testing-probe marks for further electrical connection.

Referring FIG. 5 and FIG. 7B collaboratively, in some embodiments, a portion of the conductive pads 540 may extend outside the contact pad 220 along a direction parallel to a surface of the contact pad 220. In some embodiments, the testing probe may contact the conductive pads 540 in restricted areas, for example, area 542A and area 542B. Therefore, the testing-probe marks would be generated within the area 542A and area 542B, and leave the rest of the part of the conductive pads 540 and the contact pad 220 intact, to maintain the electrical properties of the contact pad 220 and the conductive pads 540 without the testing-probe marks for further electrical connection.

It should be noted that, the contact pad 220, the conductive pads 260, and the conductive pads 540, illustrated herein, are only exemplary, and not intended to limit the present disclosure. For example, in other embodiments, the semiconductor device 200 may include more conductive pads 260, such as four conductive pads 260, respectively, installed on a contact pad 220. For example, the conductive pads 260, and the conductive pads 540 can be collectively installed on a contact pad 220. It should be understood that, the forming and arrangement of the conductive pads 260 and the conductive pads 540 could be adjusted to actual demand by those skilled in the art, without departing from the scope or the spirit of the present disclosure.

Figure 8:
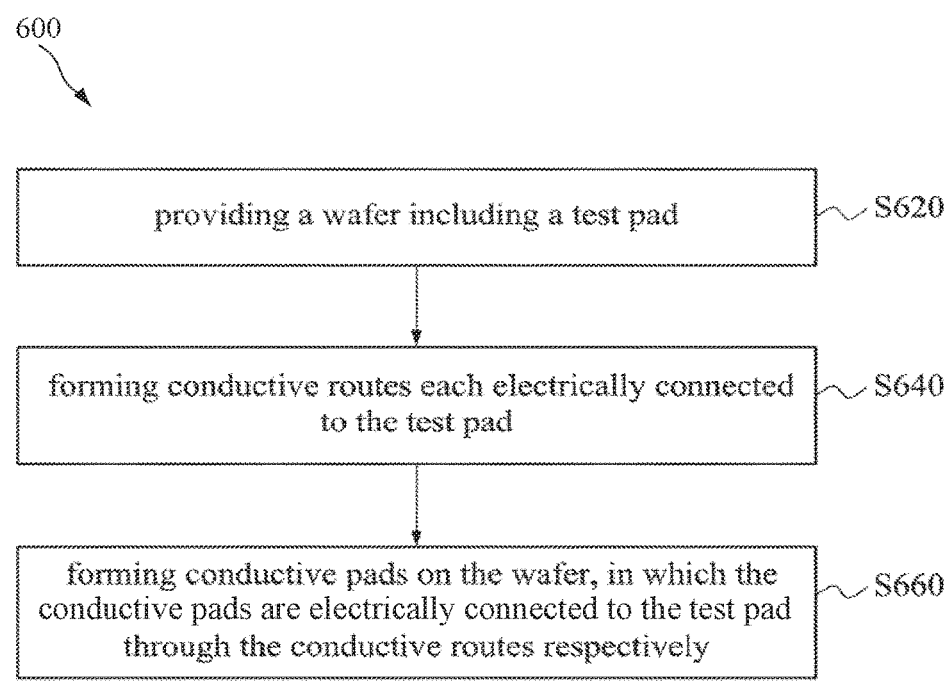
FIG. 8 is a flowchart of a conductive pads forming method, to fabricate conductive pads for a test pad according to some embodiments of the present disclosure.

FIG. 8 illustrates a flowchart of a conductive pads forming method 600, to fabricate conductive pads for a test pad according to some embodiments of the present disclosure. As shown in FIG. 8, the conductive pads forming method 600 begins with step S620 in which a wafer including a test pad is provided. In some embodiments, the test pad is electrically connected to semiconductor components, such as dies or other suitable components. Subsequently, the conductive pads forming method 600 continues with step S640 in which conductive routes are formed, and each of the conductive routes is electrically connected to the test pad. Then, the conductive pads forming method 600 continues with step S660 in which conductive pads are formed on the wafer, and electrically connected to the test pad through the conductive routes, respectively. That is, the conductive routes are each electrically connected between a corresponding one of the conductive pads and the test pad. In some embodiments, the contact pad is formed on a conductive feature, and the conductive routes and the conductive pads are formed on the test pad, and extended away from the conductive feature.

Owing to the conductive pads forming method 600, which forms conductive pads electrically connected to the test pad, such that the testing probe can contact the conductive pads, and be further electrically connected with the semiconductor components on which the electrical tests can be executed. The electrical tests described herein may be a wafer acceptance test (WAT). Consequently, the testing-probe marks generated by the testing probe under the repetitive electrical tests would only be generated on the conductive pads instead of the test pad, such that the forming of the conductive pads can provide a greater area for the testing probe to contact, and prevent or avoid the test pad being damaged by the testing-probe marks under the repetitive electrical tests. Since the electrical properties of the test pad or a portion of the conductive pads without the testing-probe marks may be stable, the conductive pads replaced the test pad for being contact with the testing probe may keep the test pad intact for more repetitive electrical tests.

In addition, in some embodiments, semiconductor components can further electrically connect to an exposed surface of the test pad or a portion of the conductive pads without the testing-probe marks for being electrically connected with semiconductor components formed inside the wafer. Owing to the electrical properties of the test pad or a portion of the conductive pads without the testing-probe marks, may be more stable compared to the electrical properties of the test pad or conductive pads with the testing-probe marks, the conductive pads replacing the test pad for being in contact with the testing probe may keep the test pad intact for further being electrically connected with other semiconductor components.

Figure 9:
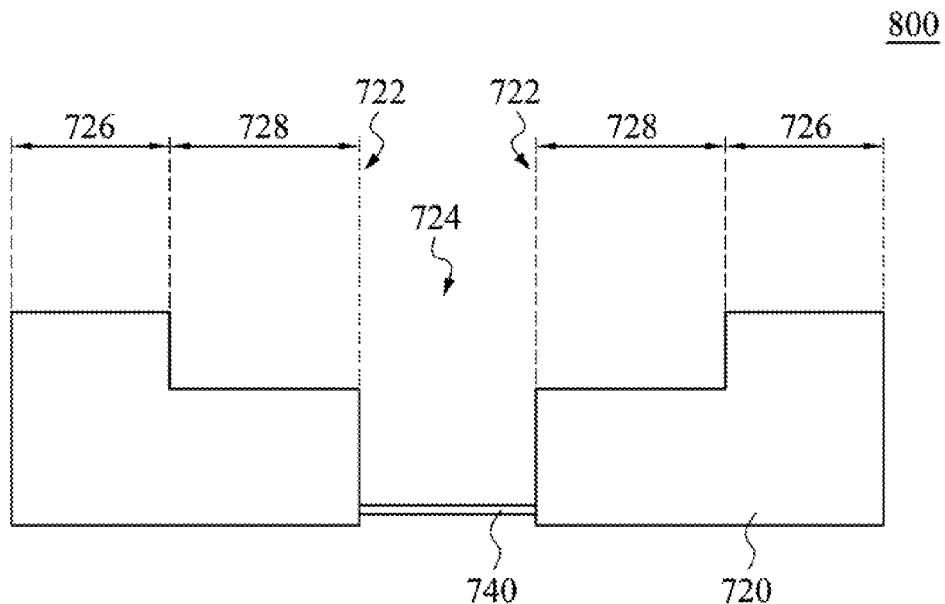
FIG. 9 to FIG. 11B are cross-sectional views of forming conductive pads at various stages according to various embodiments of the present disclosure.

FIG. 9 to FIG. 11B illustrate cross-sectional views of forming conductive pads 780 or conductive pads 780' at various stages according to various embodiments of the present disclosure. As shown in FIG. 9, in some embodiments, a wafer 720 is provided. Subsequently, scribe lines 722 may be formed on the wafer 720. Then, a via 724 may be formed on the wafer 720 between two adjacent scribe lines 722. In some embodiments, subsequently, the wafer 720 is thinned from one side, to form first regions 726 and second regions 728, in which the second regions 728 are located between the first regions 726 and the via 724. Second surfaces 7282 of the wafer 720 on the second regions 728 are lower compared to first surfaces 7262 of the wafer 720 on the first regions 726. In some embodiments, the forming of the via 724 and the thinning of the wafer 720 to form the first regions 726 and the second regions 728 can be performed at the same time. In some embodiments, a conductive feature electrically connected to semiconductor components within the wafer 720 can be formed inside the via 724. In some embodiments, test pad 740 is formed inside the via 724. In some embodiments, material of the test pad 740 can be aluminum, aluminum alloy or other suitable conductive material or alloy.

Figure 10:
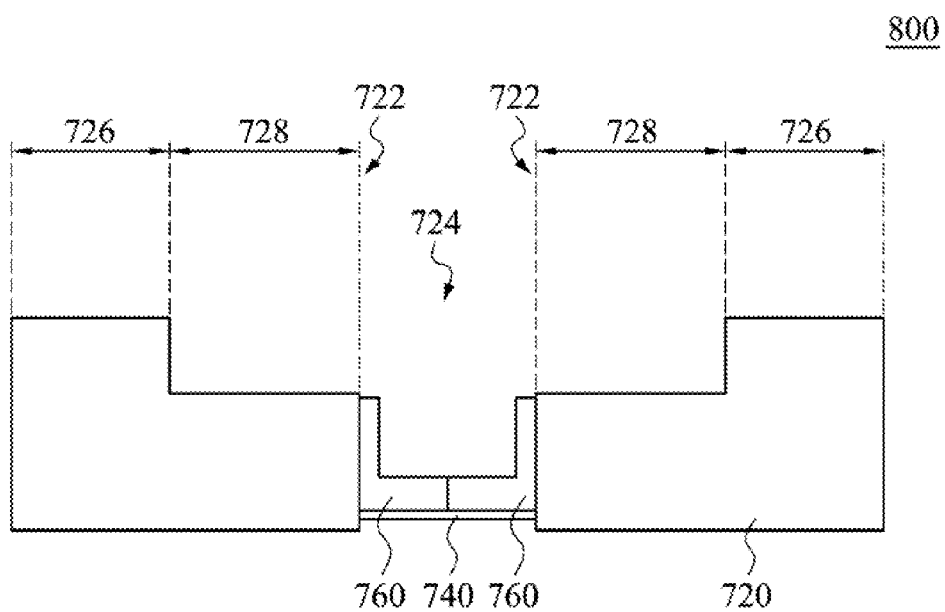
Figure 11A:
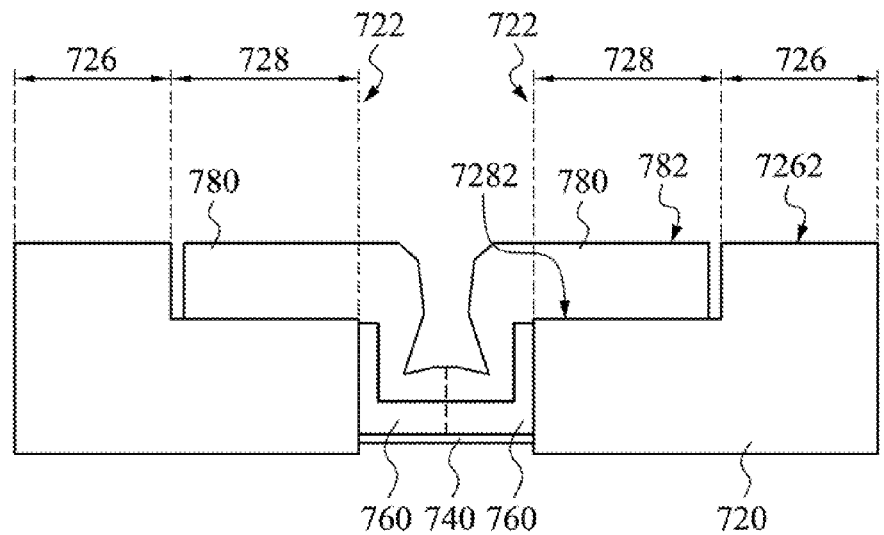

Referring to FIG. 10 and FIG. 11A, in some embodiments, subsequently, conductive routes 760 can be, formed collectively, and electrically connected to the test pad 740, and each other. Then, conductive pads 780 are formed on the second regions 728 and the conductive routes 760. The conductive pads 780 can be electrically connected to the test pad 740 through the conductive routes 760 respectively. Therefore, the conductive routes 760 may contact to the test pad 740 with a greater area, which can endure greater current or input. In some embodiments, the conductive routes 760 and the conductive pads 780 can be formed collectively.

In some embodiments, the conductive pads 780 are formed across the scribe lines 722. In some embodiments, a surface 782 of the conductive pads 780 away from the wafer 720 is substantially aligned with the surface 7262 of the wafer 720 on the first regions 726. Therefore, while the wafer 720 is cut or diced along the scribe lines 722, the lower second regions 728 and the surface 782 of the conductive pads 780 aligned with the surface 7262 of the wafer 720 on the first regions 726 may prevent or avoid the fringe of the wafer 720 along the scribe lines 722 being chipped under a cutting or dicing process, to make a smooth surface on the separated wafer 720, which may enable the semiconductor device 700 to have better electrical properties.

Figure 11B:
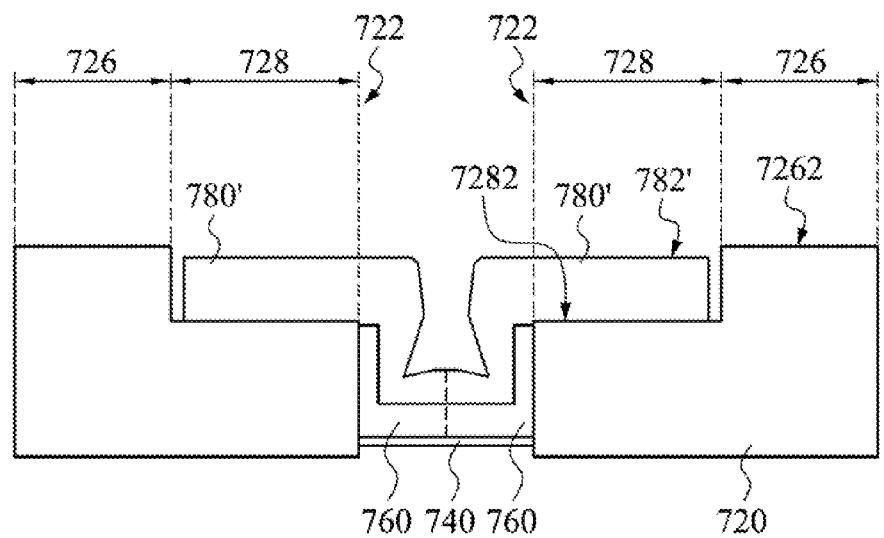

Referring to FIG. 11B, in some embodiments, a surface 782' of the conductive pads 780' away from the wafer 720 is substantially lower than the surface 7262 of the wafer 720 on the first regions 726. As a consequence, while the wafer 720 is cut or diced along the scribe lines 722, the lower second regions 728 and the surface 782' of the conductive pads 780', which is lower than the surface 7262 of the wafer 720 on the first regions 726 may prevent or avoid the fringe of the wafer 720 along the scribe lines 722 being chipped under a cutting or dicing process, to make a smooth surface on the separated wafer 720, which may also enable the semiconductor device 700' to have better electrical properties.

Figure 12A:
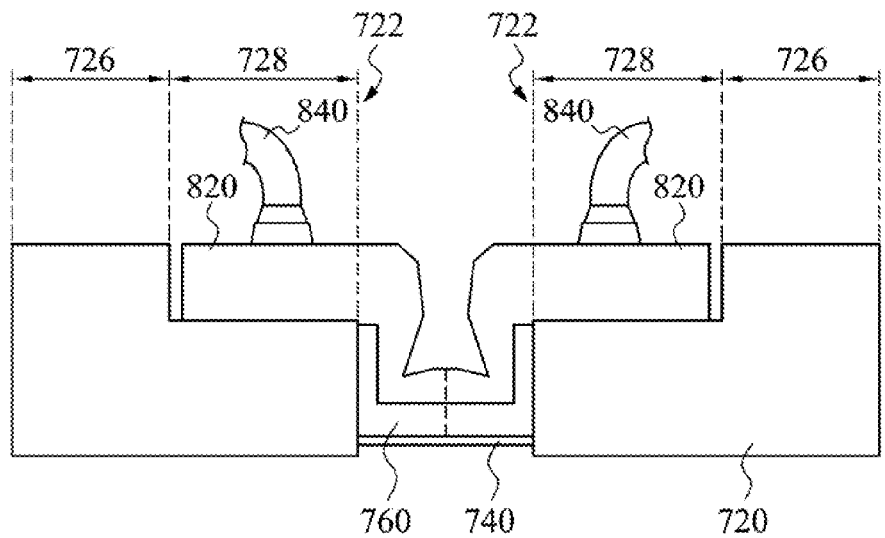
FIG. 12A and FIG. 12B are cross-sectional views of a semiconductor device according to various embodiments of the present disclosure.
Figure 12B:
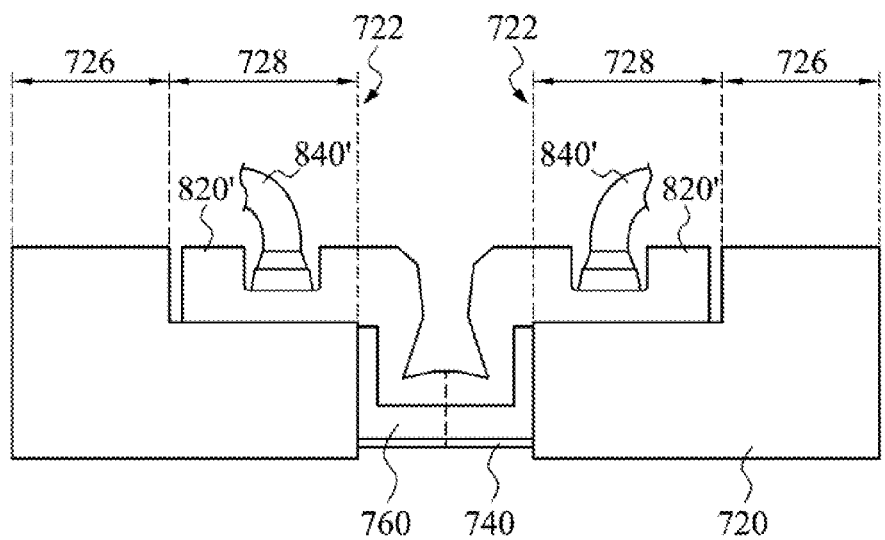

FIG. 12A and FIG. 12B, respectively, illustrate cross-sectional views of a semiconductor device 800 and a semiconductor device 800' according to various embodiments of the present disclosure. As shown in FIG. 12A, in some embodiments, a semiconductor device 800 may further include metal wires 840 being bonded to the conductive pads 820, respectively. In some embodiments, the metal wires 840 are bonded onto a portion of the conductive pads 820 without the testing-probe marks, to avoid contacting the testing-probe marks to pursue stable electrical properties. In some embodiments, the metal wires 840 are bonded onto a portion of the conductive pads 820 within the second regions 728. In some embodiments, material of the metal wires 840 can be silver, silver alloy, copper, copper alloy, or other suitable conductive material or alloy. That is, the semiconductor device 800 may employ the metal wires 840 to electrically connect to other semiconductor devices or other semiconductor components.

Referring to FIG. 12B, in other embodiments, the metal wires 840' are bonded to form a semiconductor device 800' while an end of each of the metal wires 840' are embedded into the conductive pads 820', to enhance bonding strength between the metal wires 840' and the conductive pads 820'.

Figure 13A:
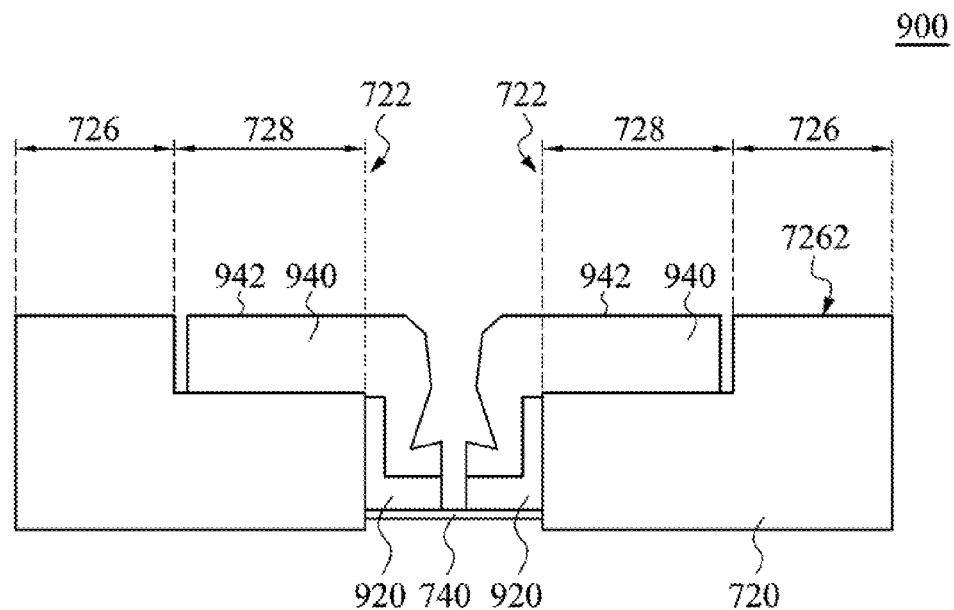
FIG. 13A and FIG. 13B are cross-sectional views of forming conductive pads according to various embodiments of the present disclosure.
Figure 13B:
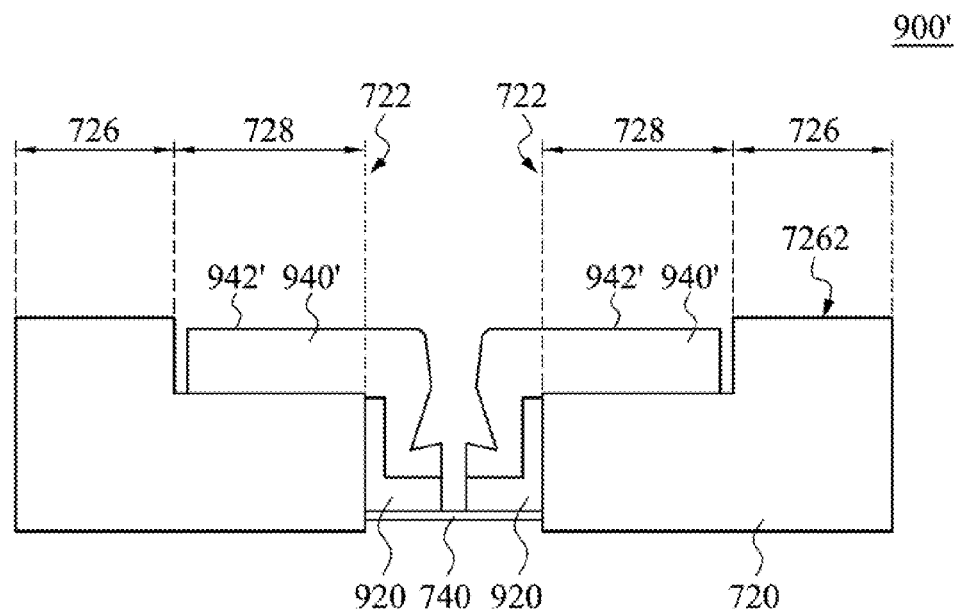

FIG. 13A and FIG. 13B illustrate cross-sectional views of forming conductive pads 940 and conductive pads 940' according to various embodiments of the present disclosure. As shown in FIG. 13A, in some embodiments, conductive routes 920 are formed insulated with each other above the test pad 740, and the conductive routes 920 are electrically connected to the test pad 740, respectively. Subsequently, conductive pads 940 are formed on the conductive routes 920, and the conductive pads 940 are electrically connected to the test pad 740 through the conductive routes 920, respectively. In some embodiments, the conductive routes 920 and the conductive pads 940 can be formed at the same time. Therefore, a semiconductor device 900 including a test pad 740, the conductive routes 920 and the conductive pads 940 is formed, and the electrical tests can be executed on semiconductor components within the wafer 720 through the test pad 740 in the manner that employing a testing probe on one of the conductive pads 940, or employing one or more testing probes with different inputs on the conductive pads 940, to generate various input condition, such as gradient electric field . . . etc., for various electrical tests. That is, while the conductive routes 920 are insulated with each other above the test pad 740, the electrical tests executed by the testing probes may have a greater flexibility. Moreover, in some embodiments, various electrical inputs can also be electrically connected to the conductive pads 940, which could be adjusted to actual demands by those skilled in the art, without departing from the scope or the spirit of the present disclosure.

In some embodiments, a surface 942 of the conductive pads 940 away from the wafer 720 is substantially aligned with the surface 7262 of the wafer 720 on the first regions 726. Therefore, while the wafer 720 is cut or diced along the scribe lines 722, the lower second regions 728 and the surface 942 of the conductive pads 940 aligned with the surface 7262 of the wafer 720 on the first regions 726 may prevent or avoid the fringe of the wafer 720 along the scribe lines 722 being chipped under a cutting or dicing process, to make a smooth surface on the separated wafer 720, which may enable the semiconductor device 900 to have better electrical properties.

Referring to FIG. 13B, in some embodiments, a surface 942' of the conductive pads 940' away from the wafer 720 is substantially lower than the surface 7262 of the wafer 720 on the first regions 726. As a consequence, while the wafer 720 is cut or diced along the scribe lines 722, the lower second regions 728 and the surface 942' of the conductive pads 940' lower than the surface 7262 of the wafer 720 on the first regions 726 may prevent or avoid the fringe of the wafer 720 along the scribe lines 722 being chipped under a cutting or dicing process, to make a smooth surface on the separated wafer 720, which may also enable the semiconductor device 900' to have better electrical properties.

Summarized from the above, the present disclosure provides a conductive pads forming method. The conductive pads forming method includes providing a contact pad electrically connected to a semiconductor component; and forming conductive pads connected to the contact pad, respectively.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the processes, machines, fabrications, compositions, of matter, means, methods, and steps described in the specification. As one of ordinary skill in the art will readily appreciate from the disclosure of the present disclosure, processes, machines, fabrications, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabrications, compositions of matter, means, methods, or steps.

What is claimed is:

1. A conductive pads forming method comprising:
   providing a contact pad electrically connected to a semiconductor component;
   forming a plurality of conductive pads connected to the contact pad respectively; and
   bonding a plurality of metal wires to the conductive pads, respectively.

2. The conductive pads forming method of claim 1, wherein the forming of the conductive pads comprises:
   forming a plurality of conductive routes electrically connected to each other; and
   forming the conductive pads electrically connected to the contact pad through the conductive routes, respectively.

3. The conductive pads forming method of claim 1, wherein the forming of the conductive pads comprises:
   forming a plurality of conductive routes insulated with each other above the contact pad; and
   forming the conductive pads electrically connected to the contact pad through the conductive routes, respectively.

4. The conductive pads forming method of claim 1, wherein the bonding of the metal wires comprises embedding the metal wires into the conductive pads.

5. The conductive pads forming method of claim 1, further comprising forming supporting layers on the contact pad, wherein the supporting layers comprise at least one interlayer, wherein the forming of the conductive pads comprises forming the conductive pads on the supporting layers, respectively.

6. The conductive pads forming method of claim 5, wherein the at least one interlayer of the supporting layers comprises silicon nitride.

7. A conductive pads forming method comprising:
   providing a wafer comprising a test pad;
   forming a plurality of conductive pads on the wafer, wherein each conductive pad is electrically connected to the test pad; and
   bonding a plurality of metal wires to the conductive pads, respectively.

8. The conductive pads forming method of claim 7, wherein the forming of the conductive pads comprises tinning a plurality of conductive routes each electrically connected between a corresponding one of the conductive pads and the test pad.

9. The conductive pads forming method of claim 8, wherein the forming of the conductive routes comprises forming the conductive routes electrically connected to each other.

10. The conductive pads forming method of claim 8, wherein the forming of the conductive routes comprises forming the conductive routes insulated with each other above the test pad.

11. The conductive pads forming method of claim 7, further comprising:
    forming a plurality of scribe lines on the wafer;
    forming a via on the wafer between two adjacent scribe lines; and
    forming the test pad inside the via.

12. The conductive pads forming method of claim 11, further comprising:
    thinning the wafer, to form first regions and second regions, wherein the second regions are located between the first regions and the via, and second surfaces of the wafer on the second regions are lower compared to first surfaces of the wafer on the first regions; and
    forming the conductive pads on the second regions.

13. The conductive pads forming method of claim 12, wherein the forming of the via and the thinning of the wafer are performed at the same time.

14. The conductive pads forming method of claim 12, wherein a surface of the conductive pads away from the wafer is substantially aligned with or lower than a surface of the wafer on the first regions.

15. The conductive pads forming method of claim 11, wherein the forming of the conductive pads comprises forming the conductive pads across the scribe lines.

16. The conductive pads forming method of claim 7, wherein the bonding of the metal wires comprises embedding the metal wires into the conductive pads.

* * * * *

UNITED STATES PATENT AND TRADEMARK OFFICE
CERTIFICATE OF CORRECTION

PATENT NO.        : 9,735,119 B1                               Page 1 of 1
APPLICATION NO.   : 15/219265
DATED             : August 15, 2017
INVENTOR(S)       : Tzung-Han Lee It is certified that error appears in the above-identified patent and that said Letters Patent is hereby corrected as shown below:

On the Title Page
In Item (72) Inventor(s),    change "Tzung-Han Lee, Taipei (TW)"
                             to --Tzung-Han Lee, Taipei City (TW)--

In the Specification

| | | |
|---|---|---|
| Column 1, | Line 3, | change subtitle "BACKGROUND" to --TECHNICAL FIELD-- |
| Column 1, | Line 9, | insert prior to subtitle "Description of Related Art" subtitle --BACKGROUND-- |
| Column 1, | Line 35, | change subtitle "SUMMARY" to --BRIEF SUMMARY-- |
| Column 1, | Line 46, | change "routes respectively." to --routes, respectively.-- |
| Column 2, | Line 53, | change "various states according" to --various stages according-- |
| Column 5, | Line 38, | change "Referring FIG. 3" to --Referring to FIG. 3-- |
| Column 5, | Line 50, | change "Referring FIG. 5" to --Referring to FIG. 5-- |
| Column 7, | Line 17, | change "can be, formed" to --can be formed-- |

In the Claims
Claim 8,    Column 10,    Line 15,    change "tinning a plurality" to --forming a plurality--

Signed and Sealed this
Tenth Day of October, 2017

Joseph Matal
*Performing the Functions and Duties of the
Under Secretary of Commerce for Intellectual Property and
Director of the United States Patent and Trademark Office*